US012672437B2

(12) United States Patent
He et al.

(10) Patent No.: US 12,672,437 B2
(45) Date of Patent: Jun. 30, 2026

(54) ORGANIC LIGHT-EMITTING DISPLAY SUBSTRATE, METHOD FOR MANUFACTURING THE SAME, AND DISPLAY DEVICE

(71) Applicant: BOE Technology Group Co., Ltd., Beijing (CN)

(72) Inventors: Wei He, Beijing (CN); Xiang Li, Beijing (CN); Haowei Zou, Beijing (CN); Sheng Xu, Beijing (CN); Lizhen Zhang, Beijing (CN); Shipei Li, Beijing (CN); Huili Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 397 days.

(21) Appl. No.: 17/625,712

(22) PCT Filed: Jan. 28, 2021

(86) PCT No.: PCT/CN2021/074098
§ 371 (c)(1),
(2) Date: Jan. 7, 2022

(87) PCT Pub. No.: WO2022/160164
PCT Pub. Date: Aug. 4, 2022

(65) Prior Publication Data
US 2023/0157132 A1 May 18, 2023

(51) Int. Cl.
*G02B 30/26* (2020.01)
*H10K 59/121* (2023.01)
(Continued)

(52) U.S. Cl.
CPC ........... *H10K 59/123* (2023.02); *G02B 30/26* (2020.01); *H10K 59/1213* (2023.02);
(Continued)

(58) Field of Classification Search
CPC ........... H10K 59/80515; H10K 50/813; H10K 59/122; H10K 59/12; H10K 59/131;
(Continued)

(56) References Cited

U.S. PATENT DOCUMENTS

2005/0259142 A1 11/2005 Kwak
2008/0018243 A1 1/2008 Ishiguro et al.
(Continued)

FOREIGN PATENT DOCUMENTS

CN 1702720 A 11/2005
CN 101000921 A 7/2007
(Continued)

OTHER PUBLICATIONS

Second Office Action in the Chinese Patent Application No. 202180000085.1, dated Feb. 27, 2024; English translation attached.

*Primary Examiner* — Matthew C Landau
*Assistant Examiner* — David W Ward
(74) *Attorney, Agent, or Firm* — Intellectual Valley Law, P.C.

(57) ABSTRACT

Provided are an organic light-emitting display substrate, a manufacturing method thereof and a display device. The display substrate includes a base substrate, a metal reflection layer and multiple pixels. Each pixel includes multiple sub-anodes. The metal reflection layer is insulated from the layer where the sub-anodes are located, the metal reflection layer includes multiple metal reflection patterns separated from each other, and each metal reflection pattern corresponds to one pixel. An orthographic projection of each metal reflection pattern onto the base substrate overlaps with orthographic projections of the multiple sub-anodes of the corresponding pixel onto the base substrate. The sub-anodes of each pixel are arranged at intervals, and a distance between orthographic projections of two adjacent sub-an-
(Continued)

odes onto the base substrate is less than or equal to a first preset threshold.

12 Claims, 9 Drawing Sheets

(51) Int. Cl.
　　*H10K 59/122*　　　(2023.01)
　　*H10K 59/123*　　　(2023.01)
　　*H10K 59/80*　　　　(2023.01)
(52) U.S. Cl.
　　CPC ....... *H10K 59/1216* (2023.02); *H10K 59/122* (2023.02); *H10K 59/80515* (2023.02); *H10K 59/878* (2023.02); *H10K 59/879* (2023.02)
(58) Field of Classification Search
　　CPC ........... H10K 59/1315; H10K 59/1213; H10K 59/878; H10K 59/1216; H10K 50/856; H10K 59/00; H10K 59/121; H10K 59/123; H10K 50/814; H10K 50/858; H10K 59/879; G02B 30/26
　　See application file for complete search history.

(56) References Cited

U.S. PATENT DOCUMENTS

| | | | |
|---|---|---|---|
| 2010/0200875 | A1 | 8/2010 | Takei |
| 2013/0153915 | A1 | 6/2013 | Choi et al. |
| 2015/0228930 | A1 | 8/2015 | Murata |
| 2016/0293878 | A1 | 10/2016 | Maruyama et al. |
| 2017/0336643 | A1 | 11/2017 | Lu et al. |
| 2018/0102498 | A1* | 4/2018 | Shin ..................... H10K 59/131 |
| 2020/0273411 | A1 | 8/2020 | Gao et al. |
| 2020/0286432 | A1* | 9/2020 | Zhang .................. G09G 3/3258 |
| 2020/0312930 | A1* | 10/2020 | Choi ...................... H10K 50/19 |
| 2021/0174746 | A1* | 6/2021 | Zhang .................. G09G 3/3258 |
| 2021/0288283 | A1* | 9/2021 | Song ..................... H10K 71/00 |
| 2022/0059631 | A1* | 2/2022 | Zhang .................. H10K 59/123 |
| 2022/0093710 | A1 | 3/2022 | Li et al. |
| 2022/0320194 | A1* | 10/2022 | Du ........................ H10K 59/353 |
| 2022/0399528 | A1* | 12/2022 | Zhao .................. H10K 50/856 |
| 2023/0247890 | A1* | 8/2023 | Zhao ............... H10K 59/80516 257/72 |

FOREIGN PATENT DOCUMENTS

| | | | |
|---|---|---|---|
| CN | 101800240 A | 8/2010 | |
| CN | 103165648 A | 6/2013 | |
| CN | 104570372 A | 4/2015 | |
| CN | 104835829 A | 8/2015 | |
| CN | 109599062 A | 4/2019 | |
| CN | 110518142 A | 11/2019 | |
| CN | 110571352 A | 12/2019 | |
| CN | 110718571 A | 1/2020 | |
| CN | 110808274 A | 2/2020 | |
| CN | 111668240 A | 9/2020 | |
| CN | 111740035 A | 10/2020 | |
| CN | 111900267 A * | 11/2020 | ............ H10K 59/12 |
| CN | 112103322 A | 12/2020 | |

* cited by examiner

--Prior Art-- sub-anode                      sub-anode left-eye
sub-anode right-eye
sub-anode second
direction first
direction lens light-emitting
layer 1022        1021                                    101

1023  1022  1024          1021

1023  1022  1024      1025  1021

1023  1022  1024  1026  1025  1021

1029      1027 1023  1022  1024  1026  1025  1021

1029  1028  1027 1023  1022  1024  1026  1025  1021

1028 1027 1023 1022 1024 1026 1025 1021 1029

1030    1028 1027 1023 1022 1024 1026 1025 1021 1029

103

102

101

1030    1028 1027 1023 1022 1024 1026 1025 1021 1029

ORGANIC LIGHT-EMITTING DISPLAY SUBSTRATE, METHOD FOR MANUFACTURING THE SAME, AND DISPLAY DEVICE

CROSS-REFERENCE TO RELATED APPLICATION

This application is the U.S. national phase of PCT Application No. PCT/CN2021/074098 filed on Jan. 28, 2021, the disclosure of which is incorporated in its entirety by reference herein.

TECHNICAL FIELD

The present disclosure relates to the field of display technologies, and in particular to an organic light-emitting display substrate, a method for manufacturing the same, and a display device.

BACKGROUND

In 3D display devices of types such as OLED (organic light-emitting diode), miniLED (mini light-emitting diode), microLED (micro light-emitting diode), QLED (quantum dot organic light-emitting diode), a light-emitting layer of a light-emitting element needs to be placed on a focal plane of the lens. The light-emitting element includes a plurality of pixels (such as R, G, B), and each pixel includes a plurality of sub-anodes. Restricted by the technological level, the size of a gap between adjacent sub-anodes is relatively large. As a result, when the light-emitting layer is placed on the focal plane of the lens to achieve 3D display, due to the magnification of the lens, the gap between the adjacent sub-anodes is enlarged, so that there will be alternately light and dark Moiré patterns, and the display effect is affected.

SUMMARY

Embodiments of the present disclosure provide an organic light-emitting display substrate, a method for manufacturing the same, and a display device, which are used to solve a problem of Moiré defects in a 3D display device due to a large gap between adjacent sub-anodes.

In order to solve the above technical problem, the present disclosure is implemented as follows.

In a first aspect, an embodiment of the present disclosure provides an organic light-emitting display substrate, including a substrate and a plurality of pixels arranged on the base substrate. The plurality of pixels is arranged along a first direction to form a plurality of pixel rows, the plurality of pixel rows is arranged along a second direction, an included angle between the first direction and the second direction range from 80 degrees to 100 degrees, and each of the pixels includes a plurality of sub-anodes. The organic light-emitting display substrate further includes a metal reflection layer, the metal reflection layer is located between the base substrate and a layer where the plurality of sub-anodes is located, the metal reflection layer is insulated from the layer where the plurality of sub-anodes are located, the metal reflection layer includes a plurality of metal reflection patterns separated from each other, and each of the metal reflection patterns corresponds to one of the pixels. An orthographic projection of each of the metal reflection patterns onto the base substrate overlaps with orthographic projections of the plurality of sub-anodes of a pixel corresponding to the metal reflection pattern onto the base substrate. The plurality of sub-anodes of each of the pixels is arranged at intervals, and a distance between orthographic projections of two adjacent sub-anodes onto the base substrate is less than or equal to a first preset threshold; the first preset threshold is 3.5 μm or 2 μm.

Optionally, the distance between the orthographic projections of two adjacent sub-anodes onto the base substrate is greater than or equal to a second preset threshold, and the second preset threshold is 0.5 μm.

Optionally, each of the pixels includes a column of sub-anodes, and the column of sub-anodes includes a plurality of sub-anodes arranged in the second direction.

Optionally, each pixel includes two columns of sub-anodes, each column of sub-anodes includes a plurality of sub-anodes arranged in the second direction, each of the two column of sub-anodes includes a plurality of sub-anodes arranged in the second direction, one column of the two columns of sub-anodes is a left-eye sub-anode, and another column of the two columns of sub-anodes is a right-eye sub-anode, where light emitted by a sub-pixel corresponding to the left-eye sub-anode is used to form a left-eye image, and light emitted by a sub-pixel corresponding to the right-eye sub-anode is used to form a right-eye image.

Optionally, the size of the left-eye sub-anode in the first direction is greater than the size of the left-eye sub-anode in the second direction, and the size of the right-eye sub-anode in the first direction is larger than the size of the right-eye sub-anode in the second direction.

Optionally, a column of the left-eye sub-anode and a column of the right-eye sub-anode in a same pixel are arranged in a staggered manner in the second direction.

Optionally, orthographic projections of the left-eye sub-anode and the right-eye sub-anode of a same pixel onto a straight line extending in the second direction are overlapped.

Optionally, in a same pixel, a minimum distance between the left-eye sub-anode and the right-eye sub-anode is smaller than a minimum distance between left-eye sub-anodes, and the minimum distance between the left-eye sub-anode and the right-eye sub-anode is smaller than a minimum distance between right-eye sub-anodes.

Optionally, among each column of sub-anodes, each of two sub-anodes at an edge in the second direction has a size in the second direction larger than the other sub-anodes in the second direction.

Optionally, the organic light-emitting display substrate further includes a plurality of sub-pixel circuits located between the base substrate and the metal reflection layer, and an insulating layer between the metal reflection layer and the layer where the sub-anodes are located, where the insulating layer is provided with a plurality of anode holes, and each of the sub-anodes is coupled to a corresponding one of the sub-pixel circuits through one of the anode holes.

Optionally, each column of sub-anodes corresponds to a plurality of anode holes, and positions of the plurality of anode holes in the first direction are different.

Optionally, an orthographic projection of each of the sub-anodes onto the base substrate includes a first edge portion, a middle portion and a second edge portion arranged in the first direction, an orthographic projection of a part of the anode holes onto the base substrate is located in the first edge portion of the orthographic projection of the corresponding sub-anode onto the base substrate, an orthographic projection of a part of the anode holes onto the base substrate is located in the middle portion of the orthographic projection of the corresponding sub-anode onto the base substrate, and an orthographic projection of a part of the anode holes onto the base substrate is located in the second edge portion of the orthographic projection of the corresponding sub-anode onto the base substrate.

Optionally, for an anode hole whose orthographic projection is located in the middle portion of the orthographic projection of the corresponding sub-anode onto the base substrate, the sub-anode corresponding to the anode hole is located in an edge of a pixel corresponding to the anode hole in the second direction.

Optionally, the organic light-emitting display substrate further includes a source-drain metal layer, and the source-drain metal layer includes a plurality of traces, each of the sub-anodes corresponds to one of the traces, the sub-anode is coupled to the corresponding trace through one of the anode holes, traces corresponding to different sub-anodes are not in contact, and an orthographic projection of an anode hole of each of the sub-anodes onto the base substrate does not overlap orthographic projections of traces of any other sub-anodes onto the base substrate.

Optionally, an orthographic projection of each of the metal reflection patterns onto the base substrate does not overlap orthographic projections of anode holes corresponding to the plurality of sub-anodes of the corresponding pixel onto the base substrate.

Optionally, the organic light-emitting display substrate further includes a pixel definition layer, where the pixel definition layer includes a plurality of openings respectively corresponding to the plurality of pixels, an orthographic projection of each of the openings onto the base substrate overlaps with orthographic projections of the plurality of sub-anodes of the corresponding pixel onto the base substrate, and the orthographic projection of each of the openings onto the base substrate is located within an orthographic projection of one of the metal reflection patterns corresponding to the opening onto the base substrate.

Optionally, each of the pixels has a light-emitting layer, an orthographic projection of the light-emitting layer onto the base substrate overlaps with the orthographic projections of the plurality of sub-anodes of the corresponding pixel onto the base substrate, and the orthographic projection of the light-emitting layer onto the base substrate covers an orthographic projection of a corresponding opening of the pixel definition layer onto the base substrate.

Optionally, each column of sub-anodes includes a first sub-anode, a second sub-anode, a third sub-anode and a fourth sub-anode arranged in the second direction, and each of the pixels includes two sub-pixel circuits; where one of the two sub-pixel circuits is coupled to two sub-anodes of the first sub-anode, the second sub-anode, the third sub-anode and the fourth sub-anode, and another of the two sub-pixel circuits is coupled to the other two sub-anodes of the first sub-anode, the second sub-anode, the third sub-anode and the fourth sub-anode.

Optionally, among the two sub-pixel circuits, one sub-pixel circuit is coupled to the first sub-anode and the third sub-anode, and the other sub-pixel circuit is coupled to the second sub-anode and the fourth sub-anode, where light emitted by sub-pixels corresponding to the first sub-anode and the third sub-anode is used to form a left-eye image, and light emitted by sub-pixels corresponding to the second sub-anode and the fourth sub-anode is used to form a right-eye image; or, light emitted by sub-pixels corresponding to the first sub-anode and the third sub-anode is used to form a right-eye image, and light emitted by sub-pixels corresponding to the second sub-anode and the fourth sub-anode is used to form a left-eye image.

Optionally, each of the sub-pixel circuits includes: a thin film transistor T1, a thin film transistor T2, a thin film transistor T3, a thin film transistor T4, a thin film transistor T5, a thin film transistor T6, a thin film transistor T7 and a capacitor C1, where a gate electrode of the thin film transistor T1 is coupled to an (n−1)-th gate line, a first electrode of the thin film transistor T1 is coupled to a reset voltage signal line, and a second electrode of the thin film transistor T1 is coupled to a node A;

a gate electrode of the thin film transistor T2 is coupled to an n-th gate line, a first electrode of the thin film transistor T2 is coupled to a data line, and a second electrode of the thin film transistor T2 is coupled to a node B;

a gate electrode of the thin film transistor T3 is coupled to the node A, a first electrode of the thin film transistor T3 is coupled to the node B, and a second electrode of the thin film transistor T3 is coupled to a node C;

a gate electrode of the thin film transistor T4 is coupled to the n-th gate line, a first electrode of the thin film transistor T4 is coupled to the node C, and a second electrode of the thin film transistor T4 is coupled to the node A;

a gate electrode of the thin film transistor T5 is coupled to a first light-emitting control line, a first electrode of the thin film transistor T5 is coupled to the node B, and a second electrode of the thin film transistor T5 is coupled to a node D;

a gate electrode of the thin film transistor T6 is coupled to a second light-emitting control line, a first electrode of the thin film transistor T6 is coupled to the node C, and a second electrode of the thin film transistor T6 is coupled to the first sub-anode or the second sub-anode;

a gate electrode of the thin film transistor T7 is coupled to a third light-emitting control line, a first electrode of the thin film transistor T7 is coupled to the node C, and a second electrode of the thin film transistor T7 is coupled to the third sub-anode or the fourth sub-anode;

a first electrode of the capacitor C1 is coupled to the node A, and a second electrode of the capacitor C1 is coupled to the node D; and the node D is coupled to a power line, and n is a positive integer greater than 1.

In a second aspect, an embodiment of the present disclosure provides a display device including the organic light-emitting display substrate in the above first aspect.

In a third aspect, an embodiment of the present disclosure provides a method for manufacturing an organic light-emitting display substrate, including:

providing a base substrate;

forming a metal reflection layer on the base substrate, where the metal reflection layer includes a plurality of metal reflection patterns separated from each other;

forming an insulating layer on a side of the metal reflection layer away from the base substrate; and forming a plurality of pixels on a side of the insulating layer away from the base substrate, where the plurality of pixels is arranged along a first direction to form a plurality of pixel rows, the plurality of pixel rows is arranged along a second direction, an included angle between the first direction and the second direction range from 80 degrees to 100 degrees, and each of the pixels includes a plurality of sub-anodes;

where, each of the metal reflection patterns corresponds to one of the pixels; an orthographic projection of each of the metal reflection patterns onto the base substrate overlaps with orthographic projections of the plurality of sub-anodes of a pixel corresponding to the metal reflection pattern onto the base substrate;

the plurality of sub-anodes of each of the pixels is arranged at intervals, and a distance between orthographic projections of two adjacent sub-anodes onto the base substrate is less than or equal to a first preset threshold; the first preset threshold is 3.5 μm or 2 μm.

In the embodiments of the present disclosure, the anode is a single-layer transparent anode and does not include a metal reflection layer. Thus, the manufacture of the anode will not be limited by the exposure and etching process of the metal reflection layer, which results in a too large space between adjacent sub-anodes in the same sub-pixel, and a distance between adjacent sub-anodes in the same sub-pixel can be controlled to be less than or equal to the first preset threshold. Therefore, when the organic light-emitting display substrate is applied to 3D display, the influence of Moiré patterns can be reduced or eliminated, thereby improving the display effect.

DETAILED DESCRIPTION

Technical solutions in embodiments of the present disclosure will be clearly and completely described below in conjunction with the accompanying drawings in the embodiments of the present disclosure. Obviously, the described embodiments are part of the embodiments of the present disclosure, not all of the embodiments. Based on the embodiments in the present disclosure, all other embodiments obtained by a person of ordinary skill in the art without creative effort shall fall within the protection scope of the present disclosure.

Figure 1:
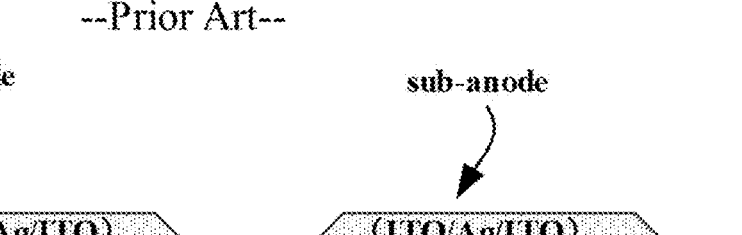
FIG. 1 is a schematic diagram of an anode in a 3D display substrate in the related art.

In the related art, a pixel on the 3D display substrate includes multiple sub-anodes. The sub-anodes are usually in a three-layer structure of ITO/Ag/ITO (indium tin oxide/silver/indium tin oxide). In the process of forming a sub-anode, a deposited Ag film layer requires to be etched. Due to the limitation of the exposure and etching process, the bias of the Ag pattern formed after etching is relatively large, which results in a relatively large space (Space) between adjacent sub-anodes in the same pixel, usually larger than 3.5 please refer to FIG. 1.

In a 3D display device, a light-emitting layer of a pixel needs to be placed on a focal plane of the lens to achieve 3D display. Due to the magnification of the lens, the lens may magnify the space between adjacent sub-anodes, which will appear alternately light and dark Moiré patterns in displaying, and affect the display effect.

Figure 2:
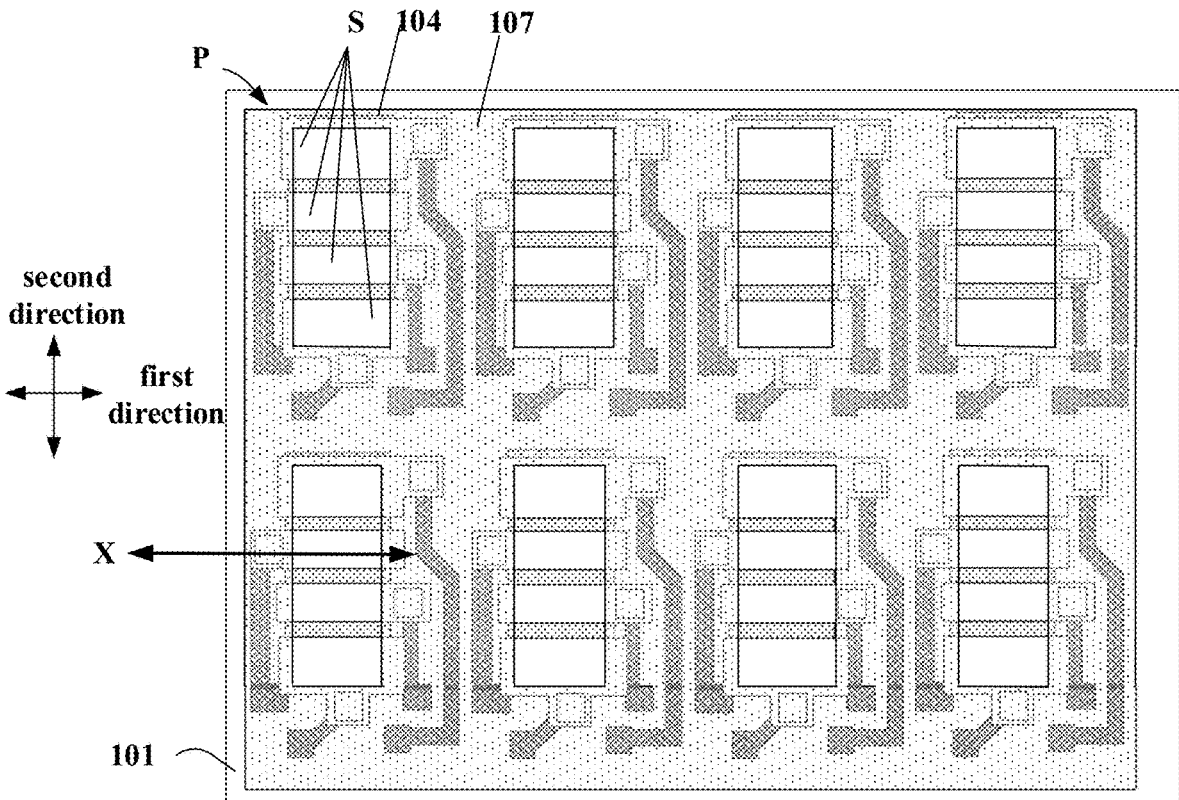
FIG. 2 is a schematic structural diagram of an organic light-emitting display substrate according to an embodiment of the present disclosure.
Figure 3:
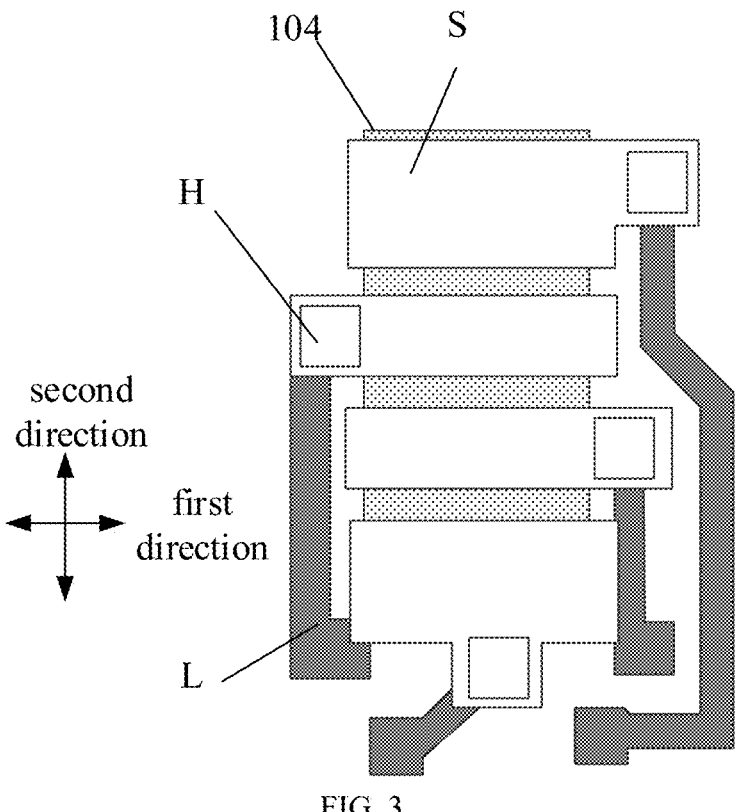
FIG. 3 is a schematic structural diagram of a pixel of the organic light-emitting display substrate shown in FIG. 2.

In order to solve the above problem, referring to FIG. 2 and FIG. 3, an embodiment of the present disclosure provides an organic light-emitting display substrate, which includes: a base substrate 101 and a plurality of pixels P arranged on the base substrate 101. The plurality of pixels P are arranged in a first direction to form pixel rows, and a plurality of pixel rows are arranged in a second direction. An angle between the first direction and the second direction is 80 to 100 degrees, optionally 90 degrees. Each of the pixels includes a plurality of sub-anodes S.

The organic light-emitting display substrate further includes a metal reflection layer located between the base substrate 101 and a layer where the plurality of sub-anodes S are located. The metal reflection layer is insulated from the layer where the plurality of sub-anodes S are located. The metal reflection layer includes a plurality of metal reflection patterns 104 separated from each other, and each of the metal reflection patterns 104 corresponds to one of the pixels P. An orthographic projection of each metal reflection pattern 104 onto the base substrate 101 overlaps with orthographic projections of the plurality of sub-anodes S of the corresponding pixel P onto the base substrate 101.

The plurality of sub-anodes S of each pixel P are arranged at intervals, and a distance between orthographic projections of two adjacent sub-anodes onto the base substrate is less than or equal to a first preset threshold, where the first preset threshold is 3.5 μm or 2 μm.

In an embodiment of the present disclosure, optionally, the sub-anode is made of a metal oxide material.

In an embodiment of the present disclosure, optionally, the metal reflection layer is made of a metal material or a metal alloy material, for example, Ag, nano Ag, Ag alloy, ITO/Ag/ITO, Al, Al/ITO, or Al alloy material.

In the embodiments of the present disclosure, the anode is a single-layer transparent anode and does not include a metal reflection layer. Thus, the manufacture of the anode will not be limited by the exposure and etching process of the metal reflection layer, which results in a too large space between adjacent sub-anodes in the same sub-pixel, and a distance between adjacent sub-anodes in the same sub-pixel can be controlled to be less than or equal to the first preset threshold. Therefore, when the organic light-emitting display substrate is applied to 3D display, the influence of Moiré patterns can be reduced or eliminated, thereby improving the display effect.

In some embodiments of the present disclosure, since the sub-anode also has a little bias, for example, the bias of the sub-anode made of ITO is 0.5 μm. Therefore, optionally, a distance between orthographic projections of two adjacent sub-anodes onto the base substrate is greater than or equal to a second preset threshold, and the second preset threshold is 0.5 μm.

In the embodiments shown in FIG. 2 and FIG. 3, each pixel P includes a column of sub-anodes, and the column of sub-anodes includes a plurality of sub-anodes S arranged in the second direction.

Optionally, a part of the plurality of sub-anodes S arranged in the second direction is a left-eye sub-anodes, and another part of the plurality of sub-anodes S is a right-eye sub-anode, where light emitted by a sub-pixel corresponding to the left-eye sub-anode is used to form a left-eye image, and light emitted by a sub-pixel corresponding to the right-eye sub-anode is used to form a right-eye image.

Optionally, the left-eye sub-anode and the right-eye sub-anode are alternately arranged to improve the display effect. For example, one pixel in FIG. 2 and FIG. 3 includes a first sub-anode, a second sub-anode, a third sub-anode and a fourth sub-anode. The first sub-anode and the third sub-anode are left-eye sub-anodes, and the second sub-anode and the fourth sub-anode are right-eye sub-anodes; or, the first sub-anode and the third sub-anode are right-eye sub-anodes, and the second sub-anode and the fourth sub-anode are left-eye sub-anodes.

In an embodiment shown in FIGS. 2 and 3, optionally, the size of the left-eye sub-anode in the first direction is greater than the size of the left-eye sub-anode in the second direction, and the size of the right-eye sub-anode in the first direction is larger than the size of the right-eye sub-anode in the second direction.

In an embodiment shown in FIGS. 2 and 3, optionally, in each column of sub-anodes, each of two sub-anodes S at an edge in the second direction has a size in the second direction larger than the other sub-anodes S in the second direction. This design considers a CD bias of the sub-anode and a crosstalk between pixels, and the sub-anode at the edge has a relatively large size, but in fact, the effects of the sub-anodes are the same after the light-emitting layer is lighten.

In the foregoing embodiments, one pixel includes one column of sub-anodes. In some other embodiments of the present disclosure, one pixel may also include two rows of sub-anodes.

In the embodiments shown in FIG. 2 and FIG. 3, an arrangement structure of the pixels may be in a row-column matrix, or other structures, such as a diamond structure.

Figure 4:
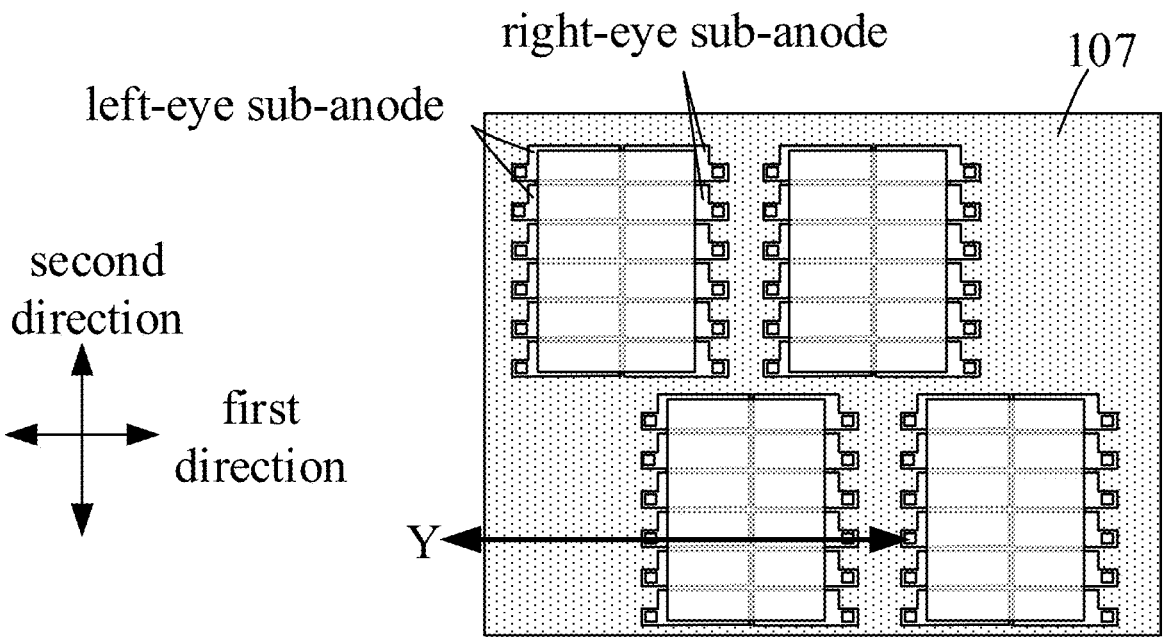
FIG. 4 is a schematic structural diagram of an organic light-emitting display substrate according to another embodiment of the present disclosure.

Referring to FIG. 4, in other embodiments of the present disclosure, optionally, each pixel P includes two columns of sub-anodes, each column of sub-anodes includes a plurality of sub-anodes S arranged in the second direction, one column of the two columns of sub-anodes is the left-eye sub-anode, and the other column is the right-eye sub-anode, where light emitted by a sub-pixel corresponding to the left-eye sub-anode is used to form a left-eye image, and light emitted by a sub-pixel corresponding to the right-eye sub-anode is used to form a right-eye image.

In an embodiment shown in FIG. 4, optionally, orthographic projections of a left-eye sub-anode column and a right-eye sub-anode column of a same pixel onto a straight line extending in the second direction are overlapped. Optionally, orthographic projections of the left-eye sub-anode column and the right-eye sub-anode column of a same pixel onto a straight line extending in the second direction are aligned. Of course, in some other embodiments of the present disclosure, optionally, the left-eye sub-anode column and the right-eye sub-anode column in the same pixel may also be arranged in a staggered manner in the second direction.

In an embodiment shown in FIG. 4, optionally, in a same pixel, a minimum distance between a left-eye sub-anode and a right-eye sub-anode is smaller than a minimum distance between left-eye sub-anodes, and the minimum distance between the left-eye sub-anode and the right-eye sub-anode is smaller than a minimum distance between right-eye sub-anodes.

Figure 5:
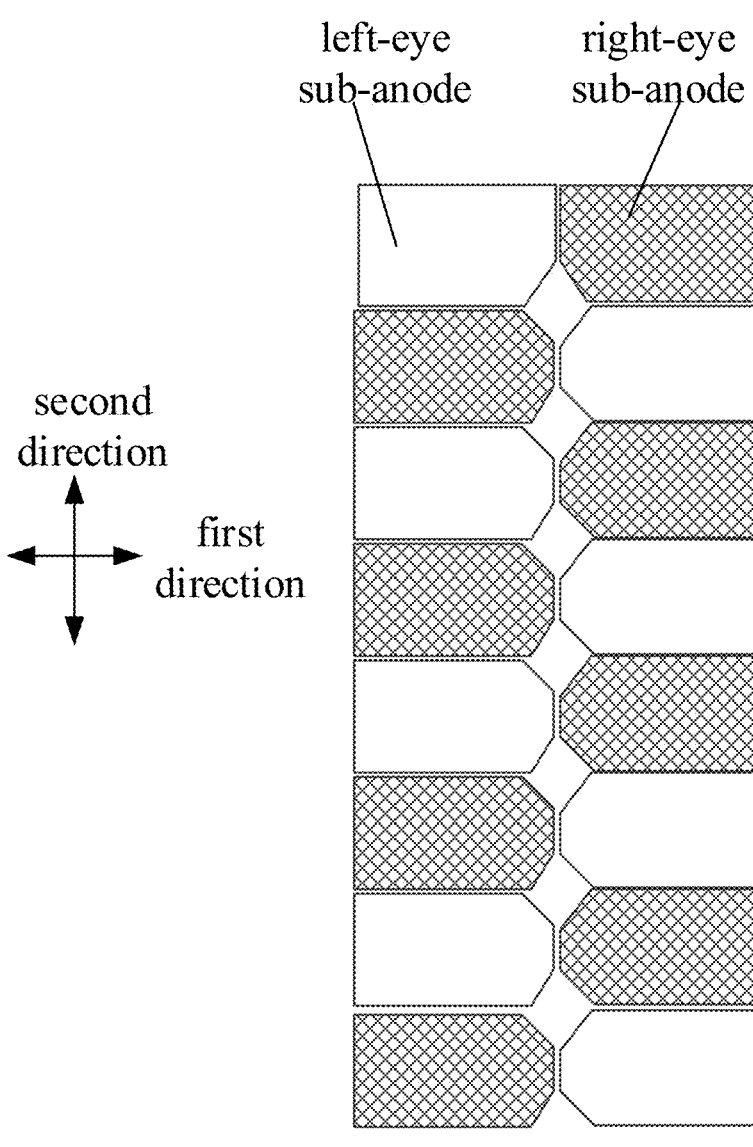
FIG. 5 is a schematic structural diagram of an organic light-emitting display substrate according to another embodiment of the present disclosure.

Referring to FIG. 5, in other embodiments of the present disclosure, optionally, each pixel P includes two columns of sub-anodes, and each column of sub-anodes includes a plurality of sub-anodes S arranged in a second direction, where each column of sub-anodes includes both the left-eye sub-anode and the right-eye sub-anode. In the second direction, the left-eye sub-anode and the right-eye sub-anode are spaced apart, and in the first direction, both the left-eye sub-anode and the right-eye sub-anode are included.

In an embodiment shown in FIG. 4 and FIG. 5, optionally, the size of the left-eye sub-anode in the first direction is greater than the size of the left-eye sub-anode in the second direction, and the size of the right-eye sub-anode in the first direction is larger than the size of the right-eye sub-anode in the second direction.

In each of the foregoing embodiments, the organic display panel further includes: a plurality of sub-pixel circuits located between the base substrate and the metal reflection layer, and an insulating layer located between the metal reflection layer and the layer where the sub-anodes are located. The insulating layer has a plurality of anode holes (referring to anode holes H in FIG. 3), and each of the sub-anodes is coupled to the corresponding sub-pixel circuit through an anode hole.

In an embodiment of the present disclosure, optionally, each column of sub-anodes corresponds to a plurality of anode holes, and positions of the plurality of anode holes in the first direction are different. Referring to FIG. 3, each pixel in FIG. 3 includes: a first sub-anode, a second sub-anode, a third sub-anode and a fourth sub-anode arranged in the second direction, each sub-anode corresponds to an anode hole H, and four anode holes have different positons in the first direction.

In an embodiment of the present disclosure, optionally, referring to FIG. 3, an orthographic projection of each of the sub-anodes onto the base substrate includes a first edge portion, a middle portion and a second edge portion arranged in the first direction, an orthographic projection of a part of the anode holes onto the base substrate is located in the first edge portion of the orthographic projection of the corresponding sub-anode onto the base substrate, an orthographic projection of a part of the anode holes onto the base substrate is located in the middle portion of the orthographic projection of the corresponding sub-anode onto the base substrate, and an orthographic projection of a part of the anode holes onto the base substrate is located in the second edge portion of the orthographic projection of the corresponding sub-anode onto the base substrate, thereby preventing traces coupled to respective sub-anodes from being crossed.

In an embodiment of the present disclosure, optionally, for an anode hole whose orthographic projection is located in the middle portion of the orthographic projection of the corresponding sub-anode onto the base substrate, the sub-anode corresponding to the anode hole is located in an edge of the corresponding pixel in the second direction, for example, a sub-anode in the bottom in FIG. 3.

In an embodiment of the present disclosure, optionally, referring to FIG. 3, the organic light-emitting display substrate further includes a source-drain metal layer, and the source-drain metal layer includes a plurality of traces L. Each sub-anode S corresponds to one trace L, and the sub-anode S is connected to the corresponding trace L through an anode hole H. Traces L corresponding to different sub-anodes S are not in contact, and an orthographic projection of an anode hole H of each sub-anode S onto the base substrate does not overlap orthographic projections of traces L of any other sub-anodes S onto the base substrate.

In an embodiment of the present disclosure, optionally, referring to FIG. 3, an orthographic projection of each of the metal reflection patterns 104 onto the base substrate does not overlap orthographic projections of anode holes H corresponding to multiple sub-anodes S of the corresponding pixel onto the base substrate.

In an embodiment of the present disclosure, optionally, referring to FIG. 3, each column of sub-anodes includes a first sub-anode, a second sub-anode, a third sub-anode and a fourth sub-anode arranged in the second direction, and each of the pixels includes two sub-pixel circuits; where one of the two sub-pixel circuits is coupled to two sub-anodes of the first sub-anode, the second sub-anode, the third sub-anode and the fourth sub-anode, and the other sub-pixel circuit is coupled to the other two sub-anodes of the first sub-anode, the second sub-anode, the third sub-anode and the fourth sub-anode.

Optionally, among the two sub-pixel circuits, one sub-pixel circuit is connected to the first sub-anode and the third sub-anode, and the other sub-pixel circuit is connected to the second sub-anode and the fourth sub-anode, where light emitted by sub-pixels corresponding to the first sub-anode and the third sub-anode is used to form a left-eye image, and light emitted by sub-pixels corresponding to the second sub-anode and the fourth sub-anode is used to form a right-eye image; or, light emitted by sub-pixels corresponding to the first sub-anode and the third sub-anode is used to form a right-eye image, and light emitted by sub-pixels corresponding to the second sub-anode and the fourth sub-anode is used to form a left-eye image.

Figure 6:
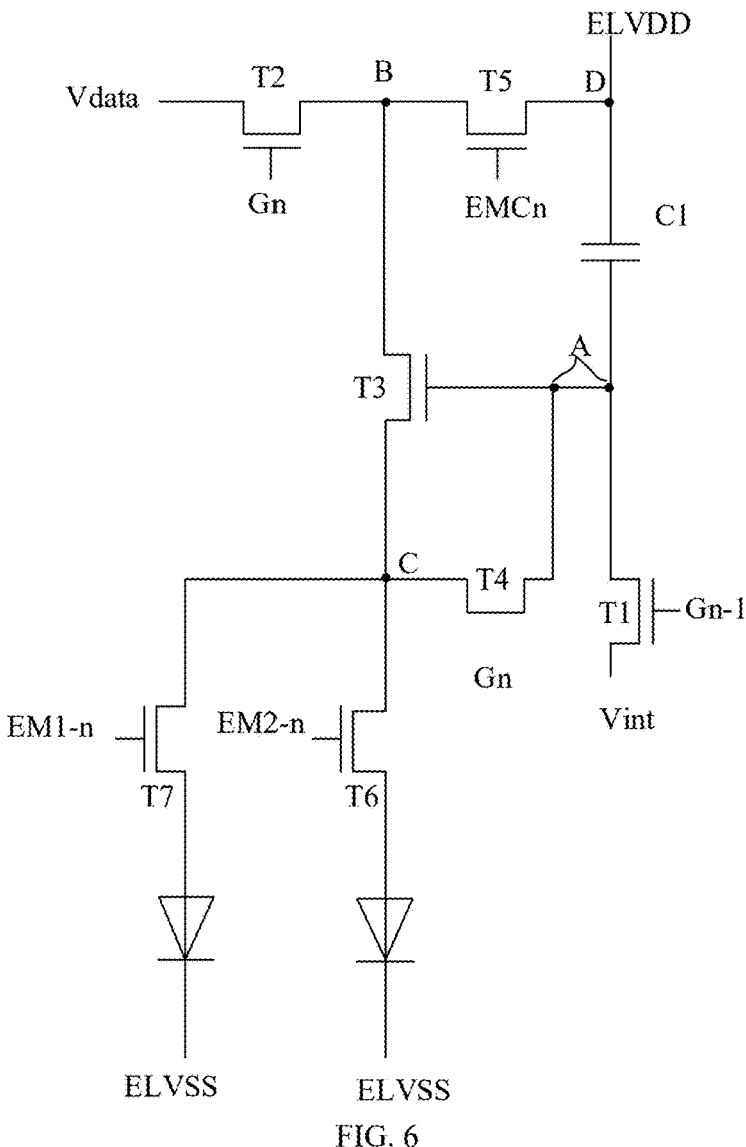
FIG. 6 is a schematic structural diagram of an organic light-emitting display substrate according to an embodiment of the present disclosure.

Referring to FIG. 6, optionally, the sub-pixel circuit includes: a thin film transistor T1, a thin film transistor T2, a thin film transistor T3, a thin film transistor T4, a thin film transistor T5, a thin film transistor T6, a thin film transistor T7, and a capacitor C1.

A gate electrode of the thin film transistor T1 is coupled to an (n−1)-th gate line (that is, for receiving a Gn−1 signal in FIG. 6), a first electrode is coupled to a reset voltage signal line, and a second electrode is coupled to a node A. One of the first electrode and the second electrodes is a source electrode, and the other is a drain electrode. The reset voltage signal line may be a Vint signal line.

A gate electrode of the thin film transistor T2 is coupled to an n-th gate line (that is, for receiving a Gn signal in FIG. 6), a first electrode is coupled to a data line, and a second electrode is coupled to a node B. One of the first electrode and the second electrode is a source electrode, the other is a drain electrode.

A gate electrode of the thin film transistor T3 is coupled to the node A, a first electrode is coupled to the node B, and a second electrode is coupled to a node C. One of the first electrode and the second electrode is a source electrode, and the other is a drain electrode.

A gate electrode of the thin film transistor T4 is coupled to the n-th gate line, a first electrode is coupled to the node C, and a second electrode is coupled to the node A. One of the first electrode and the second electrode is a source electrode, and the other is a drain electrode.

A gate electrode of the thin film transistor T5 is coupled to a first light-emitting control line, a first electrode is coupled to the node B, and a second electrode is coupled to a node D. One of the first electrode and the second electrode is a source electrode, and the other is a drain electrode. The control line is, for example, an EMCn control line.

A gate electrode of the thin film transistor T6 is coupled to a second light-emitting control line, a first electrode is coupled to the node C, and a second electrode is coupled to the first sub-anode or the second sub-anode. One of the first electrode and the second electrode is a source electrode, and the other is a drain electrode. The second light-emitting control line is, for example, an EM2-$n$ control line.

A gate electrode of the thin film transistor T7 is coupled to a third light-emitting control line, a first electrode is coupled to the node C, a second electrode is coupled to the third sub-anode or the fourth sub-anode. One of the first electrode and the second electrode is a source electrode, and the other is a drain electrode. The third light-emitting control line is, for example, the EM1-$n$ control line.

A first electrode of the capacitor C1 is coupled to the node A, and a second electrode of the capacitor C1 is coupled to the node D. The node D is coupled to a power line, and n is a positive integer greater than 1.

In an embodiment of the present disclosure, optionally, the organic light-emitting display substrate further includes a pixel definition layer, the pixel definition layer includes a plurality of openings corresponding to the pixels P in an one-to-one manner, an orthographic projection of each of the openings onto the base substrate overlaps with orthographic projections of the plurality of sub-anodes of the corresponding pixel onto the base substrate, and the orthographic projection of each of the openings onto the base substrate is located within an orthographic projection of the metal reflection pattern onto the base substrate.

In an embodiment of the present disclosure, optionally, each of the pixels has a light-emitting layer, an orthographic projection of the light-emitting layer onto the base substrate overlaps with the orthographic projections of the plurality of sub-anodes of the corresponding pixel onto the base substrate, and the orthographic projection of the light-emitting layer onto the base substrate covers an orthographic projection of a corresponding opening of the pixel definition layer onto the base substrate.

Figure 7:
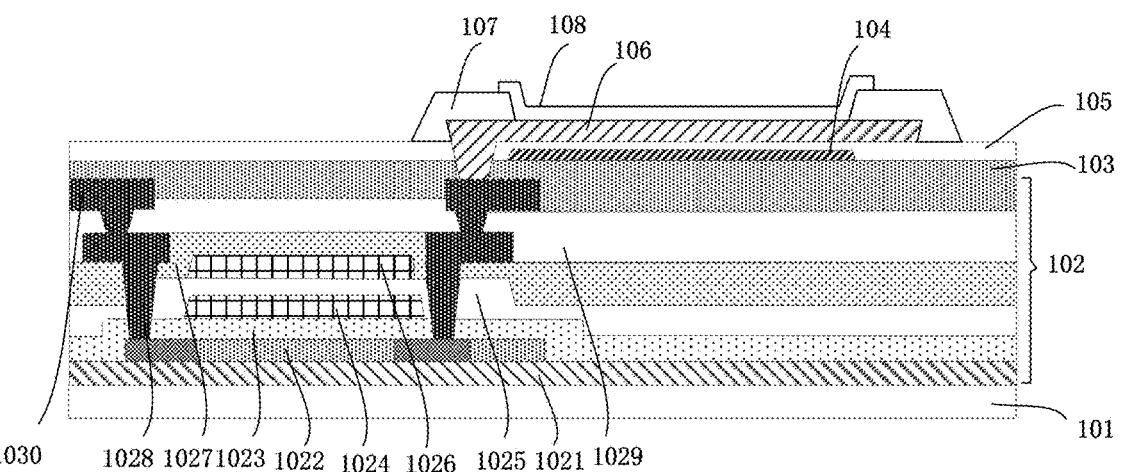
FIG. 7 is a schematic cross-sectional view taken by line X of the organic light-emitting display substrate shown in FIG. 2.

Please refer to FIG. 7. FIG. 7 is a schematic cross-sectional view taken by line X of the organic light-emitting display substrate shown in FIG. 2 according to an embodiment of the present disclosure. The organic light-emitting display substrate includes: a base substrate 101; and a plurality of pixels arranged on the base substrate 101, a plurality of the pixels are arranged in a first direction to form a pixel row, and a plurality of pixel rows are arranged in a second direction, and an included angle between the first direction and the second direction is 80 to 100 degree. Each of the pixels includes:

a thin film transistor array layer 102 disposed on a side of the base substrate 101;

a planarization layer 103 disposed on a side of the thin film transistor array layer 102 away from the base substrate 101;

a metal reflection layer disposed on a side of the planarization layer 103 away from the base substrate 101, where the metal reflection layer includes a plurality of metal reflection patterns 104 separated from each other, and each of the metal reflection patterns 104 corresponds to one of the pixels;

a first passivation layer 105 disposed on a side of the metal reflection layer away from the base substrate 101;

a plurality of sub-anodes 106 disposed on a side of the first passivation layer 105 away from the base substrate 101, where the sub-anodes 106 are a single-layer transparent anode, and the sub-anodes 106 are connected to a source-drain metal layer of the thin film transistor array layer 102 through anode holes penetrated the first passivation layer 105 and the planarization layer 103; each pixel includes a column of sub-anodes, and the column of sub-anodes includes a plurality of sub-anodes arranged in the second direction; the plurality of sub-anodes of each pixel are arranged at intervals, and a distance between orthographic projections of two adjacent sub-anodes onto the base substrate is less than or equal to a first preset threshold; the first preset threshold is 3.5 µm or 2 µm;

a pixel definition layer 107 arranged on a side of the sub-anodes 106 away from the base substrate 101;

a light-emitting layer 108 disposed on a side of the sub-anodes 106 away from the base substrate 101; and a cathode (not shown in the figure) disposed on a side of the light-emitting layer 108 away from the base substrate 101.

In the embodiment of the present disclosure, the sub-anodes 106 are a single-layer transparent anode and does not include a metal reflection layer. Thus, the manufacture of the anode will not be limited by the exposure and etching process of the metal reflection layer, which results in a too large space between adjacent sub-anodes in the same sub-pixel, and a distance between adjacent sub-anodes in the same sub-pixel can be controlled to be less than or equal to the first preset threshold. Therefore, when the organic light-emitting display substrate is applied to 3D display, the influence of Moiré patterns can be reduced or eliminated, thereby improving the display effect.

Figure 8:
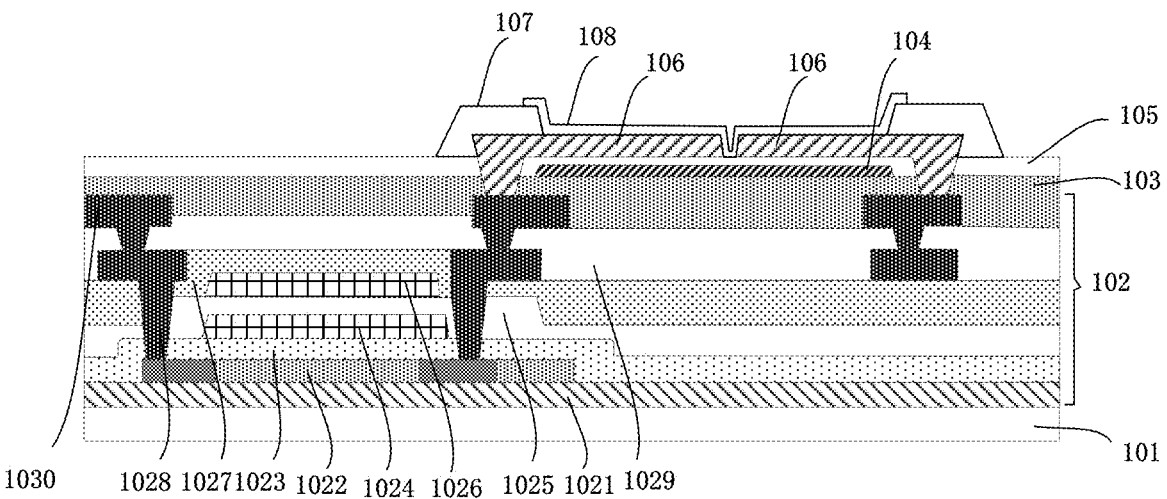
FIG. 8 is a schematic cross-sectional view taken by line Y of the organic light-emitting display substrate shown in FIG. 4.

Please refer to FIG. 8. FIG. 8 is a schematic cross-sectional view at Y of the organic light-emitting display substrate shown in FIG. 4 according to an embodiment of the present disclosure. The organic light-emitting display substrate includes: a base substrate 101; and a plurality of pixels arranged on the base substrate 101, a plurality of the pixels are arranged in a first direction to form a pixel row, and a plurality of pixel rows are arranged in a second direction, and an included angle between the first direction and the second direction is 80 to 100 degree. Each of the pixels includes:

a thin film transistor array layer 102 disposed on a side of the base substrate 101;

a planarization layer 103 disposed on a side of the thin film transistor array layer 102 away from the base substrate 101;

a metal reflection layer disposed on a side of the planarization layer 103 away from the base substrate 101, where the metal reflection layer includes a plurality of metal reflection patterns 104 separated from each other, and each of the metal reflection patterns 104 corresponds to one pixel;

a first passivation layer 105 disposed on a side of the metal reflection layer away from the base substrate 101;

a plurality of sub-anodes 106 disposed on a side of the first passivation layer 105 away from the base substrate 101, the sub-anodes 106 are a single-layer transparent anode, and the sub-anodes 106 are connected to a source-drain metal layer of the thin film transistor array layer 102 through anode holes penetrated the first passivation layer 105 and the planarization layer 103; each pixel includes two columns of sub-anodes, each column of sub-anodes includes a plurality of sub-anodes arranged in the second direction, one column of the two columns of sub-anodes is a left-eye sub-anode, and the other column is a right-eye sub-anode, where light emitted by a sub-pixel corresponding to the left-eye sub-anode is used to form a left-eye image, and light emitted by a sub-pixel corresponding to the right-eye sub-anode is used to form a right-eye image; the plurality of sub-anodes of each pixel are arranged at intervals, and a distance between orthographic projections of two adjacent sub-anodes onto the base substrate is less than or equal to a first preset threshold; the first preset threshold is 3.5 µm or 2 µm;

a pixel definition layer 107 arranged on a side of the sub-anodes 106 away from the base substrate 101;

a light-emitting layer 108 disposed on a side of the sub-anodes 106 away from the base substrate 101; and a cathode (not shown in the figure) disposed on a side of the light-emitting layer 108 away from the base substrate 101.

In an embodiment of the present disclosure, the sub-anodes 106 are a single-layer transparent anode and does not include a metal reflection layer. Thus, the manufacture of the anode will not be limited by the exposure and etching process of the metal reflection layer, which results in a too large space between adjacent sub-anodes in the same sub-pixel, and a distance between adjacent sub-anodes in the same sub-pixel can be controlled to be less than or equal to the first preset threshold. Therefore, when the organic light-emitting display substrate is applied to 3D display, the influence of Moiré patterns can be reduced or eliminated, thereby improving the display effect.

In embodiments shown in FIG. 7 and FIG. 8, optionally, the thin film transistor array layer 102 includes:

a buffer layer 1021;

an active layer 1022 disposed on a side of the buffer layer 1021 away from the base substrate;

a first gate insulating layer 1023 disposed on the active layer 1022;

a first gate metal layer 1024 disposed on a side of the first gate insulating layer 1023 away from the base substrate;

a second gate insulating layer 1025 disposed on a side of the first gate metal layer 1024 away from the base substrate;

a second gate metal layer 1026 disposed on a side of the second gate insulating layer 1025 away from the base substrate;

an interlayer dielectric layer 1027 disposed on a side of the second gate metal layer 1026 away from the base substrate;

a first source-drain metal layer 1028 disposed on a side of the interlayer dielectric layer 1027 away from the base substrate;

a second passivation layer 1029 disposed on a side of the first source-drain metal layer 1028 away from the base substrate; and a second source-drain metal layer 1030 disposed on a side of the second passivation layer 1029 away from the base substrate, where source-drain metal layer traces coupled to the sub-anodes are located in the second source-drain metal layer 1030.

Figure 23:
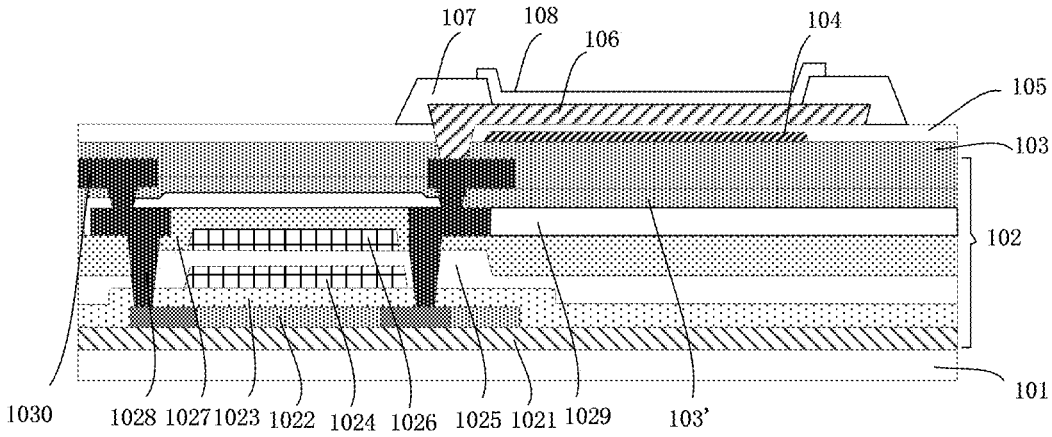
FIG. 23 is a schematic cross-sectional view of an organic light-emitting display substrate according to another embodiment of the present disclosure.

In an embodiment of the present disclosure, a second passivation layer 1029 and a planarization layer 103 are arranged on the first source-drain metal layer 1028, and a film layer sequence is the first source-drain metal layer 1028, the second passivation layer 1029, the second source-drain metal layer 1030, and the planarization layer 103 that are arranged in sequence. In some other embodiments of the present disclosure, there may also be two planarization layers on the first source-drain metal layer 1028. Referring to FIG. 23, a film layer sequence is the first source-drain metal layer 1028, the second passivation layer 1029, a planarization layer 103', the second source-drain metal layer 1030, and a planarization layer 103 that are arranged in sequence.

The organic light-emitting display substrate in the embodiment of the present disclosure has two gate metal layers and two source-drain metal layers, which can meet the requirements on wiring and capacitance. Of course, in some other embodiments of the present disclosure, it may also include only one gate metal layer, and/or one source-drain metal layer.

The thin film transistors in the above embodiments are top-gate thin film transistors, and in some other embodiments of the present disclosure, they may also be bottom-gate thin film transistors.

The organic light-emitting display substrate in the embodiments of the present disclosure may be an OLED display substrate, a miniLED display substrate, a microLED display substrate, a QLED display substrate, or other types of display substrates.

Figure 9:
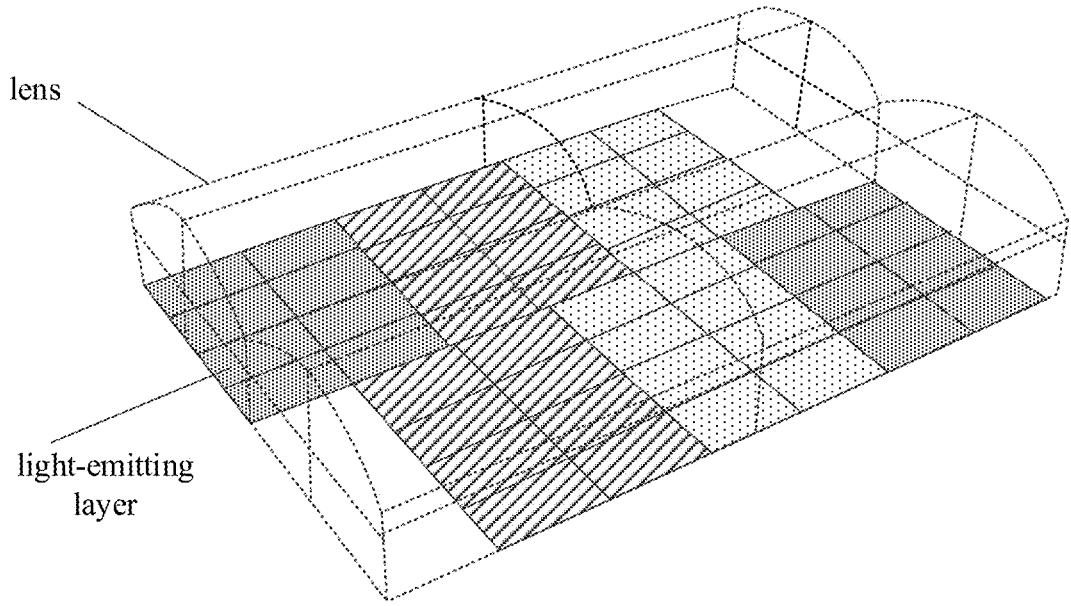
FIG. 9 is a schematic structural diagram of a 3D display device according to an embodiment of the present disclosure.
Figure 10:
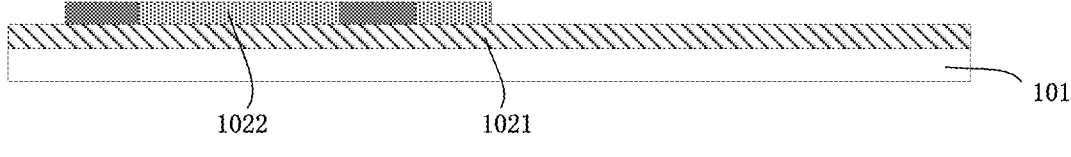
FIG. 10 to FIG. 22 are schematic diagrams showing a method of manufacturing a 3D display substrate according to an embodiment of the present disclosure.
Figure 11:
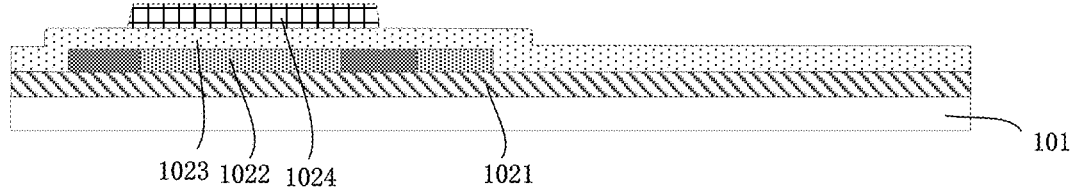
Figure 12:
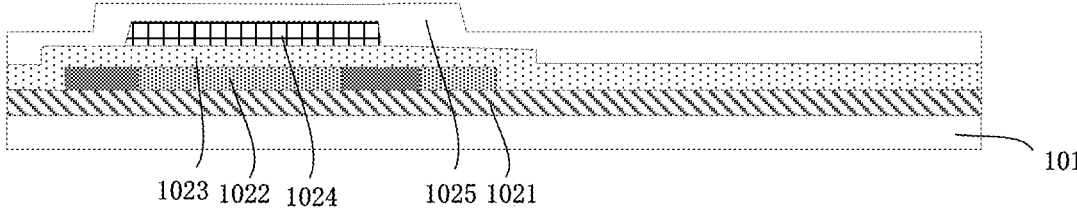
Figure 13:
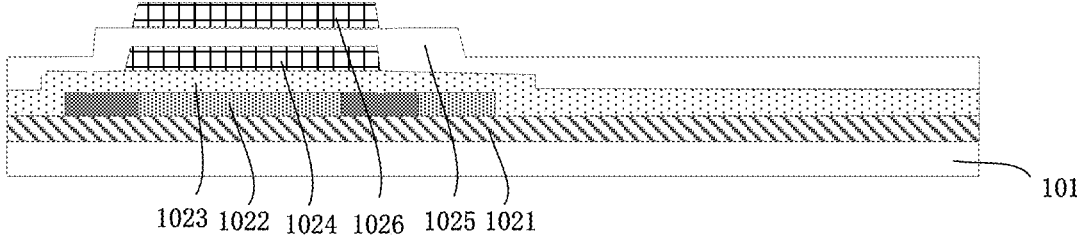
Figure 14:
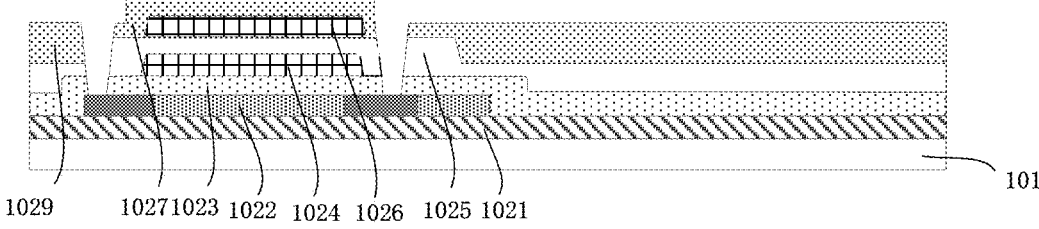
Figure 15:
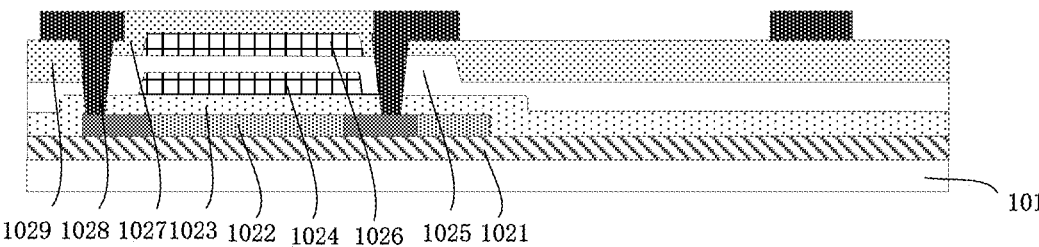
Figure 16:
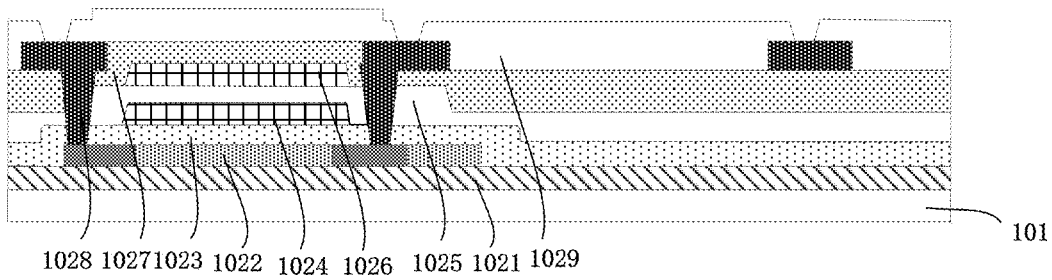
Figure 17:
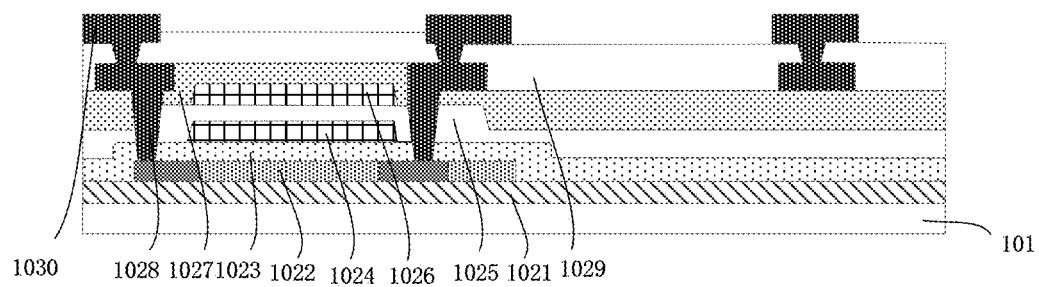
Figure 18:
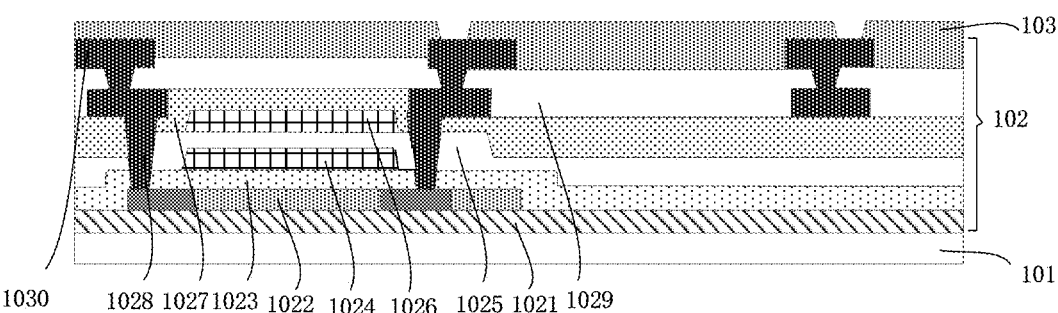
Figure 19:
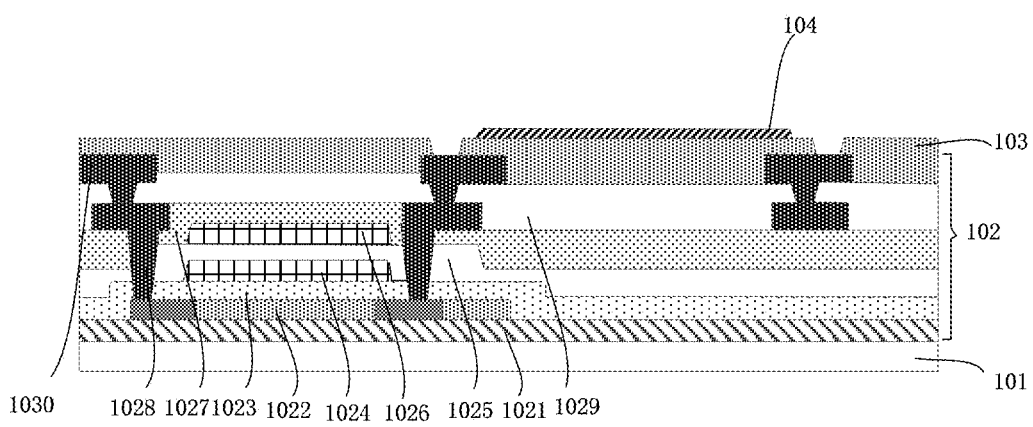
Figure 20:
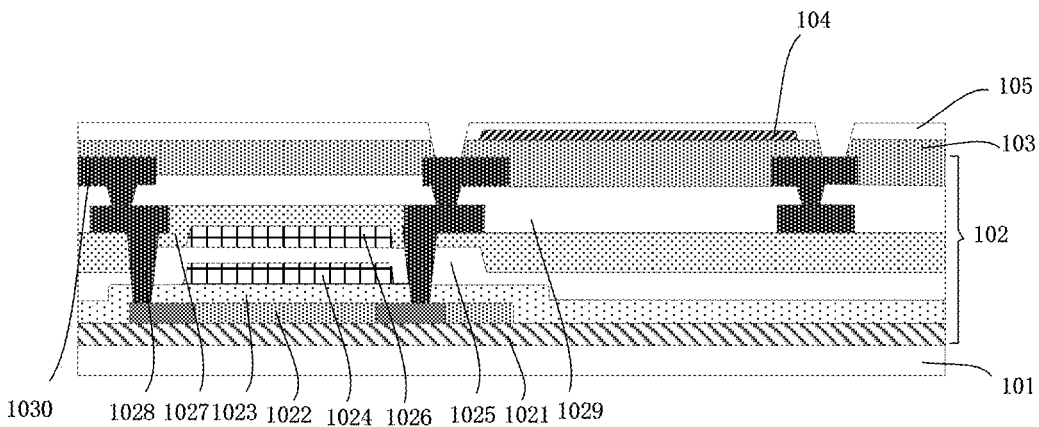
Figure 21:
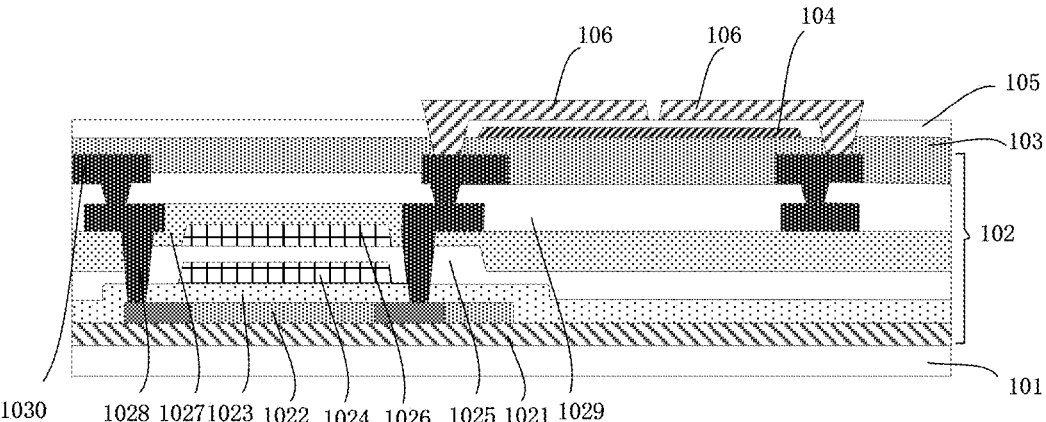
Figure 22:
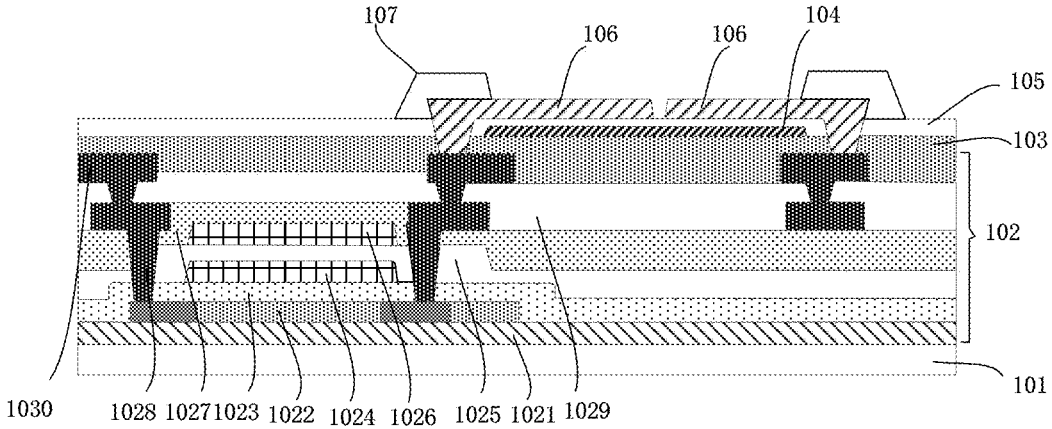

The present disclosure also provides a display device, including the organic light-emitting display substrate according to any of the above embodiments and a lens. A light-emitting layer of the organic light-emitting display substrate is arranged on a focal plane of the lens. Please refer to FIG. 9.

The present disclosure also provides a method for manufacturing an organic light-emitting display substrate, including:

step S1: providing a base substrate;

step S2: forming a metal reflection layer on the base substrate, where the metal reflection layer includes a plurality of metal reflection patterns separated from each other;

step S3: forming an insulating layer on a side of the metal reflection layer away from the base substrate; and step S4: a plurality of pixels on a side of the insulating layer away from the base substrate, where the plurality of pixels is arranged along a first direction to form a plurality of pixel rows, the plurality of pixel rows is arranged along a second direction, an included angle between the first direction and the second direction range from 80 degrees to 100 degrees, and each of the pixels includes a plurality of sub-anodes; where, each of the metal reflection patterns corresponds to one of the pixels; an orthographic projection of each of the metal reflection patterns onto the base substrate overlaps with orthographic projections of the plurality of sub-anodes of a pixel corresponding to the metal reflection pattern onto the base substrate; the plurality of sub-anodes of each of the pixels are arranged at intervals, and a distance between orthographic projections of two adjacent sub-anodes onto the base substrate is less than or equal to a first preset threshold; the first preset threshold is 3.5 μm or 2 μm.

Optionally, the distance between the orthographic projections of two adjacent sub-anodes onto the base substrate is greater than or equal to a second preset threshold, and the second preset threshold is 0.5 μm.

Optionally, each of the pixels includes a column of sub-anodes, and the column of sub-anodes includes a plurality of sub-anodes arranged in the second direction.

Optionally, each pixel includes two columns of sub-anodes, each column of sub-anodes includes a plurality of sub-anodes arranged in the second direction, one column of the two columns of sub-anodes is a left-eye sub-anode, and the other column of the two columns of sub-anodes is a right-eye sub-anode, where light emitted by a sub-pixel corresponding to the left-eye sub-anode is used to form a left-eye image, and light emitted by a sub-pixel corresponding to the right-eye sub-anode is used to form a right-eye image.

Optionally, the size of the left-eye sub-anode in the first direction is greater than the size of the left-eye sub-anode in the second direction, and the size of the right-eye sub-anode in the first direction is larger than the size of the right-eye sub-anode in the second direction.

Optionally, a column of the left-eye sub-anode and a column of the right-eye sub-anode in a same pixel are arranged in a staggered manner in the second direction.

Optionally, orthographic projections of the left-eye sub-anode and the right-eye sub-anode of a same pixel onto a straight line extending in the second direction are overlapped.

Optionally, in a same pixel, a minimum distance between the left-eye sub-anode and the right-eye sub-anode is smaller than a minimum distance between left-eye sub-anodes, and the minimum distance between the left-eye sub-anode and the right-eye sub-anode is smaller than a minimum distance between right-eye sub-anodes.

Optionally, in each column of sub-anodes, each of two sub-anodes at an edge in the second direction has a size in the second direction is larger than the other sub-anodes in the second direction.

Optionally, the method further includes: forming a plurality of sub-pixel circuits between the base substrate and the metal reflection layer, and forming an insulating layer between the metal reflection layer and the layer where the sub-anodes are located, where the insulating layer has a plurality of anode holes, and each of the sub-anodes is coupled to a corresponding one of the sub-pixel circuits through one of the anode holes.

Optionally, each column of sub-anodes corresponds to a plurality of anode holes, and the plurality of anode holes in the first direction has different positions.

Optionally, an orthographic projection of each of the sub-anodes onto the base substrate includes a first edge portion, a middle portion and a second edge portion arranged in the first direction, an orthographic projection of a part of the anode holes onto the base substrate is located in the first edge portion of the orthographic projection of the corresponding sub-anode onto the base substrate, an orthographic projection of a part of the anode holes onto the base substrate is located in the middle portion of the orthographic projection of the corresponding sub-anode onto the base substrate, and an orthographic projection of a part of the anode holes onto the base substrate is located in the second edge portion of the orthographic projection of the corresponding sub-anode onto the base substrate.

Optionally, for an anode hole whose orthographic projection is located in the middle portion of the orthographic projection of the corresponding sub-anode onto the base substrate, the sub-anode corresponding to the anode hole is located in an edge of the corresponding pixel in the second direction.

Optionally, the method further includes: forming a source-drain metal layer, where the source-drain metal layer includes a plurality of traces, each of the sub-anodes corresponds to one of the traces, the sub-anode is coupled to the corresponding trace through one of the anode holes, traces corresponding to different sub-anodes are not in contact, and an orthographic projection of an anode hole of each of the sub-anodes onto the base substrate does not overlap orthographic projections of traces of any other sub-anodes onto the base substrate.

Optionally, an orthographic projection of each of the metal reflection patterns onto the base substrate does not overlap orthographic projections of anode holes corresponding to the plurality of sub-anodes of the corresponding pixel onto the base substrate.

Optionally, the method further includes: forming a pixel definition layer, where the pixel definition layer includes a plurality of openings respectively corresponding to the plurality of pixels, an orthographic projection of each of the openings onto the base substrate overlaps with orthographic projections of the plurality of sub-anodes of the corresponding pixel onto the base substrate, and the orthographic projection of each of the openings onto the base substrate is located within an orthographic projection of the metal reflection pattern onto the base substrate.

Optionally, each of the pixels has a light-emitting layer, an orthographic projection of the light-emitting layer onto the base substrate overlaps with the orthographic projections of the plurality of sub-anodes of the corresponding pixel onto the base substrate, and the orthographic projection of the light-emitting layer onto the base substrate covers an orthographic projection of a corresponding opening of the pixel definition layer onto the base substrate.

Optionally, each column of sub-anodes includes a first sub-anode, a second sub-anode, a third sub-anode and a fourth sub-anode arranged in the second direction, and each of the pixels includes two sub-pixel circuits; where one of the two sub-pixel circuits is coupled to two sub-anodes of the first sub-anode, the second sub-anode, the third sub-anode and the fourth sub-anode, and another of the two sub-pixel circuits is coupled to the other two sub-anodes of the first sub-anode, the second sub-anode, the third sub-anode and the fourth sub-anode.

Optionally, among the two sub-pixel circuits, one sub-pixel circuit is coupled to the first sub-anode and the third sub-anode, and the other sub-pixel circuit is coupled to the second sub-anode and the fourth sub-anode, where light emitted by sub-pixels corresponding to the first sub-anode and the third sub-anode is used to form a left-eye image, and light emitted by sub-pixels corresponding to the second sub-anode and the fourth sub-anode is used to form a right-eye image; or, light emitted by sub-pixels corresponding to the first sub-anode and the third sub-anode is used to form a right-eye image, and light emitted by sub-pixels corresponding to the second sub-anode and the fourth sub-anode is used to form a left-eye image.

Optionally, the sub-pixel circuit includes: a thin film transistor T1, a thin film transistor T2, a thin film transistor T3, a thin film transistor T4, a thin film transistor T5, a thin film transistor T6, a thin film transistor T7 and a capacitor C1, where a gate electrode of the thin film transistor T1 is coupled to an (n−1)-th gate line, a first electrode of the thin film transistor T1 is coupled to a reset voltage signal line, and a second electrode of the thin film transistor T1 is coupled to a node A;

a gate electrode of the thin film transistor T2 is coupled to an n-th gate line, a first electrode of the thin film transistor T2 is coupled to a data line, and a second electrode of the thin film transistor T2 is coupled to a node B;

a gate electrode of the thin film transistor T3 is coupled to the node A, a first electrode of the thin film transistor T3 is coupled to the node B, and a second electrode of the thin film transistor T3 is coupled to a node C;

a gate electrode of the thin film transistor T4 is coupled to the n-th gate line, a first electrode of the thin film transistor T4 is coupled to the node C, and a second electrode of the thin film transistor T4 is coupled to the node A;

a gate electrode of the thin film transistor T5 is coupled to a first light-emitting control line, a first electrode of the thin film transistor T5 is coupled to the node B, and a second electrode of the thin film transistor T5 is coupled to a node D;

a gate electrode of the thin film transistor T6 is coupled to a second light-emitting control line, a first electrode of the thin film transistor T6 is coupled to the node C, and a second electrode of the thin film transistor T6 is coupled to the first sub-anode or the second sub-anode;

a gate electrode of the thin film transistor T7 is coupled to a third light-emitting control line, a first electrode of the thin film transistor T7 is coupled to the node C, and a second electrode of the thin film transistor T7 is coupled to the third sub-anode or the fourth sub-anode;

a first electrode of the capacitor C1 is coupled to the node A, and a second electrode of the capacitor C1 is coupled to the node D; and the node D is coupled to a power line, and n is a positive integer greater than 1.

Please refer to FIGS. 10 to 22, a method for manufacturing a 3D display substrate according to an embodiment of the present disclosure is as follows:

Step 501: providing a base substrate 101.

Step 502: forming a buffer layer 1021 on a side of the base substrate 101.

The buffer layer 1021 may be SiN, SiON, SiNx, or SiO2, or a stacked structure of any two or more of them. In an embodiment, the buffer layer 1021 is a stacked structure of SiNx and SiO2, a thickness of SiNx is about 200 to 400 nm, a thickness of SiO2 is about 400 to 600 nm.

Step 503: forming an active layer 1022 on a side of the buffer layer 1021 away from the base substrate 101, and patterning the active layer 1022.

The active layer may be a polysilicon active layer or an oxide active layer. In an embodiment, the active layer 1022 is polysilicon with a thickness of about 400 to 500 nm.

Step 504: forming a first gate insulating layer 1023 on a side of the active layer 1022 away from the base substrate 101.

The first gate insulating layer 1023 may be SiN, or SiON, or SiNx, or SiO2, or a stacked structure of any two or more of them. In an embodiment, the first gate insulating layer 1023 is a stacked structure of SiO2 and SiNx, where a thickness of SiO2 is about 700 to 900 nm, and a thickness of SiNx is about 300 to 500 nm.

Step 505: forming a first gate metal layer 1024 on a side of the first gate insulating layer 1023 away from the base substrate 101, and patterning the first gate metal layer.

The first gate metal layer 1024 may be made of a metal such as Mo, Ti, or Al, or an alloy of any two or more of the foregoing. In an embodiment, the first gate metal layer 1024 is made of Mo and has a thickness of about 2500 to 3500 nm.

Step 506: forming a second gate insulating layer 1025 on a side of the first gate metal layer 1024 away from the base substrate 101, and patterning the second gate insulating layer 1025.

The second gate insulating layer 1025 may be made of SiN, SiON, SiNx, or SiO2, or a stacked structure of any two or more of the foregoing. In an embodiment, the second gate insulating layer 1025 is made of SiNx with a thickness of about 1000 to 2000 nm.

Step 507: forming a second gate metal layer 1026 on a side of the second gate insulating layer 1025 away from the base substrate 101, and patterning the second gate metal layer 1026.

The second gate metal layer 1026 may be made of a metal such as Mo, Ti or Al, or an alloy of any two or more of the foregoing. In an embodiment, the second gate metal layer 1026 is made of Mo and has a thickness of about 2500-3500 nm.

Step 508: forming an interlayer dielectric layer 1027 on a side of the second gate metal layer 1026 away from the base substrate 101.

The interlayer dielectric layer 1027 may be made of SiN, SiON, SiNx, or SiO2, or a stacked structure of any two or more of them. In an embodiment, the interlayer dielectric layer 1027 is a stacked structure of SiO2 and SiNx. The thickness of SiO2 is about 1000-3000 nm, and if it is SiNx, the thickness is about 2000-4000 nm;

Step 509: forming a first source-drain metal layer 1028 on a side of the interlayer dielectric layer 1027 away from the base substrate 101, and patterning the first source-drain metal layer 1028.

The first source-drain metal layer 1028 may be made of a metal such as Mo, Ti, or Al, or a stacked structure of any two or more of the foregoing. In an embodiment, the first source-drain metal layer 1028 is a Ti/Al/Ti stacked layer, and the thicknesses of the three layers are about 400-600 nm, 3000-5000 nm, and 400-600 nm.

Step 510: forming a second passivation layer 1029 on a side of the first source-drain metal layer 1028 away from the base substrate 101, and patterning the second passivation layer 1029.

The second passivation layer 1029 may be made of SiN, SiON, SiNx, or SiO2, or a stacked structure of any two or more of the foregoing. In an embodiment, the second passivation layer 1029 is SiNx with a thickness of about 3000-4000 nm.

Step 511: forming a second source-drain metal layer 1030 on a side of the second passivation layer 1029 away from the base substrate 101 and pattering the second source-drain metal layer 1030. The second source-drain metal layer 1030 includes a source-drain metal layer trace.

The second source-drain metal layer 1030 may be made of a metal such as Mo, Ti, or Al, or a stacked structure of any two or more of the foregoing. In an embodiment, the second source-drain metal layer 1030 has a Ti/Al/Ti laminated structure, and the thicknesses of the three layers are about 400-600 nm, 3000-5000 nm, and 400-600 nm.

Step 512: forming a planarization layer 103 and patterning the planarization layer 103.

The planarization layer 103 may be made of photoresist, and its thickness is about 15000 to 25000 nm.

Step 513: forming a metal reflection layer and patterning the metal reflection layer to form a plurality of metal reflection patterns 104 separated from each other, where each of the metal reflection patterns corresponds to one pixel;

The metal reflection layer may be a high-reflectivity metal such as Ag or Al, or other materials with high reflection characteristics in a visible light region. In an embodiment, the metal reflection layer is made of Ag.

Step 514: forming a first passivation layer 105 and patterning the first passivation layer 105.

The first passivation layer 105 may be made of SiN, SiON, SiNx, or SiO2, or a stacked structure of any two or more of the foregoing. In an embodiment, the first passivation layer 105 is made of SiNx.

In the process of patterning the first passivation layer 105, since the reflective layer 104 is covered by the first passivation layer 105, it will not be oxidized. At the same time, it will not cause etching damage to the planarization layer.

Step 515: forming a plurality of sub-anodes 106 of each pixel, the plurality of sub-anodes of each pixel are arranged at intervals, and a distance between orthographic projections of two adjacent sub-anodes onto the base substrate is less than or equal to a first preset threshold, where the first preset threshold is 3.5 μm or 2 μm.

The sub-anode 106 may adopt a metal with low resistance and high work function, such as Au, or Pt, or a metal oxide such as ITO, IZO, etc. In an embodiment, the sub-anode 106 is made of ITO.

Step 516: forming a pixel definition layer 107 and performing patterning.

The pixel defining layer 107 may use photoresist, and the thickness is about 10000-15000 nm.

Step 517: forming patterns of a light-emitting layer and patterns of a cathode.

In the embodiments of the present disclosure, through a moiré simulation experiment, a corresponding relationship between the spacing or pitch of anodes of adjacent sub-pixels of a display device and a level of moiré pattern is obtained, as shown in Table 1.

TABLE 1

| Serial number of simulation | Aperture of lens (μm) | Radius of lens (μm) | Height of lens (μm) | spacing of anodes (μm) | Crosstalk of 3D view area | Level of 3D Moiré pattern |
|---|---|---|---|---|---|---|
| 1 | 54.8353 | 48.5 | 135.8 | 0.5 | 0% | 16.8% |
| 2 | 54.8353 | 50.5 | 138.3 | 0.8 | 0% | 40.2% |
| 3 | 54.8353 | 54.5 | 143.3 | 1.2 | 0% | 85.6% |
| 4 | 54.8353 | 56.5 | 145.8 | 1.5 | 0% | 84.8% |
| 5 | 54.8603 | 48.5 | 145.8 | 1.2 | 0% | 28.4% |
| 6 | 54.8603 | 50.5 | 135.8 | 1.5 | 0% | 73.7% |
| 7 | 54.8603 | 54.5 | 138.3 | 0.5 | 0% | 44.0% |
| 8 | 54.8603 | 56.5 | 143.3 | 0.8 | 0% | 39.7% |
| 9 | 54.9103 | 48.5 | 143.3 | 1.5 | 3% | 20.6% |
| 10 | 54.9103 | 50.5 | 145.8 | 1.2 | 0% | 26.4% |
| 11 | 54.9103 | 54.5 | 135.8 | 0.8 | 0% | 41.6% |

TABLE 1-continued

| Serial number of simulation | Aperture of lens (μm) | Radius of lens (μm) | Height of lens (μm) | spacing of anodes (μm) | Crosstalk of 3D view area | Level of 3D Moiré pattern |
|---|---|---|---|---|---|---|
| 12 | 54.9103 | 56.5 | 138.3 | 0.5 | 0% | 16.4% |
| 13 | 54.9353 | 48.5 | 138.3 | 0.8 | 7.2% | 9.0% |
| 14 | 54.9353 | 50.5 | 143.3 | 0.5 | 0% | 15.0% |
| 15 | 54.9353 | 54.5 | 145.8 | 1.5 | 0% | 74.6% |
| 16 | 54.9353 | 56.5 | 135.8 | 1.2 | 0% | 31.1% |

It can be seen from Table 1 that in the embodiments of the present disclosure, the distance or spacing between anodes of the left-eye sub-pixel and the right-eye sub-pixel can be adjusted from greater than 3.5 μm to be greater than or equal to 0.5 μm and less than or equal to 1.5 μm, and the level of moiré pattern can be reduced below 10%, which improves the display effect.

The embodiments of the present disclosure are described above with reference to the accompanying drawings, but the present disclosure is not limited to the above-mentioned specific embodiments. The above-mentioned specific embodiments are only illustrative and not restrictive. Those of ordinary skill in the art can make many forms under the teaching of the present disclosure without departing from the principle of the present disclosure and the protection scope of the claims, all of which shall fall within the protection scope of the present disclosure.

What is claimed is:

1. An organic light-emitting display substrate, comprising a base substrate and a plurality of pixels arranged on the base substrate, wherein the plurality of pixels is arranged along a first direction to form a pixel row, a plurality of pixel rows are arranged along a second direction, an included angle between the first direction and the second direction ranges from 80 degrees to 100 degrees, and a respective pixel of the pixels comprises a plurality of sub-anodes;

the organic light-emitting display substrate further comprises a metal reflection layer, the metal reflection layer is located between the base substrate and a layer where the plurality of sub-anodes is located, the metal reflection layer is insulated from the layer where the plurality of sub-anodes are located, the metal reflection layer comprises a plurality of metal reflection patterns separated from each other, and a respective metal reflection pattern of the metal reflection patterns corresponds to the respective pixel;

an orthographic projection of the respective metal reflection pattern onto the base substrate overlaps with orthographic projections onto the base substrate of the plurality of sub-anodes of the respective pixel corresponding to the respective metal reflection pattern; and the plurality of sub-anodes of the respective pixel is arranged at intervals, and a distance between orthographic projections of two adjacent sub-anodes onto the base substrate is less than or equal to a first preset threshold; the first preset threshold is 3.5 μm;

wherein the respective pixel comprises a column of sub-anodes, and the column of sub-anodes comprises at least three sub-anodes arranged in the second direction;

wherein the column of sub-anodes arranged in the second direction in one pixel corresponds to at least three anode holes, and positions of the at least three anode holes in the first direction and in the second direction are different from each other, wherein among the column of sub-anodes, each sub-anode of two sub-anodes at an edge in the second direction has a size in the second direction greater than sizes of other sub-anodes than the two sub-anodes in the second direction.

2. The organic light-emitting display substrate according to claim 1, wherein the distance between the orthographic projections of two adjacent sub-anodes onto the base substrate is greater than or equal to a second preset threshold, and the second preset threshold is 0.5 μm.

3. The organic light-emitting display substrate according to claim 1, further comprising: a plurality of sub-pixel circuits located between the base substrate and the metal reflection layer, and an insulating layer between the metal reflection layer and the layer where the sub-anodes are located, wherein the at least three anode holes are in the insulating layer, and a respective sub-anode of the sub-anodes is coupled to a corresponding one of the sub-pixel circuits through one of the anode holes.

4. The organic light-emitting display substrate according to claim 1, wherein an orthographic projection of a respective sub-anode onto the base substrate comprises a first edge portion, a middle portion and a second edge portion arranged in the first direction, an orthographic projection of a first part of the anode holes onto the base substrate is located in the first edge portion of the orthographic projection of a corresponding sub-anode onto the base substrate, an orthographic projection of a second part of the anode holes onto the base substrate is located in the middle portion of the orthographic projection of the corresponding sub-anode onto the base substrate, and an orthographic projection of a third part of the anode holes onto the base substrate is located in the second edge portion of the orthographic projection of the corresponding sub-anode onto the base substrate.

5. The organic light-emitting display substrate according to claim 4, wherein for an anode hole whose orthographic projection is located in the middle portion of the orthographic projection of the corresponding sub-anode onto the base substrate, a corresponding anode hole is located in an edge of a pixel corresponding to the anode hole in the second direction.

6. The organic light-emitting display substrate according to claim 3, wherein the organic light-emitting display substrate further comprises a source-drain metal layer, the source-drain metal layer comprises a plurality of traces, the respective sub-anode corresponds to one of the traces, the sub-anode is coupled to a corresponding trace through one of the anode holes, traces corresponding to different sub-anodes are not in contact, and an orthographic projection of an anode hole of the respective sub-anode onto the base substrate does not overlap orthographic projections of traces of any other sub-anodes onto the base substrate.

7. The organic light-emitting display substrate according to claim 3, wherein the orthographic projection of the respective metal reflection pattern onto the base substrate does not overlap orthographic projections of anode holes corresponding to the plurality of sub-anodes of a corresponding pixel onto the base substrate.

8. The organic light-emitting display substrate according to claim 1, further comprising a pixel definition layer, wherein the pixel definition layer comprises a plurality of openings respectively corresponding to the plurality of pixels, an orthographic projection of a respective opening of the openings onto the base substrate overlaps with the orthographic projections of the plurality of sub-anodes of a corresponding pixel onto the base substrate, and the orthographic projection of the respective opening of the openings onto the base substrate is located within an orthographic projection of one of the metal reflection patterns corresponding to the opening onto the base substrate.

9. The organic light-emitting display substrate according to claim 8, wherein the respective pixel has a light-emitting layer, an orthographic projection of the light-emitting layer onto the base substrate overlaps with the orthographic projections of the plurality of sub-anodes of the corresponding pixel onto the base substrate, and the orthographic projection of the light-emitting layer onto the base substrate covers an orthographic projection of a corresponding opening of the pixel definition layer onto the base substrate.

10. The organic light-emitting display substrate according to claim 3, wherein a respective column of sub-anodes comprises a first sub-anode, a second sub-anode, a third sub-anode and a fourth sub-anode arranged in the second direction, and the respective pixel comprises two sub-pixel circuits; wherein one of the two sub-pixel circuits is coupled to two sub-anodes of the first sub-anode, the second sub-anode, the third sub-anode and the fourth sub-anode, and another of the two sub-pixel circuits is coupled to the other two sub-anodes of the first sub-anode, the second sub-anode, the third sub-anode and the fourth sub-anode.

11. The organic light-emitting display substrate according to claim 10, wherein among the two sub-pixel circuits, one sub-pixel circuit is coupled to the first sub-anode and the third sub-anode, and the other sub-pixel circuit is coupled to the second sub-anode and the fourth sub-anode, wherein light emitted by sub-pixels corresponding to the first sub-anode and the third sub-anode is used to form a left-eye image, and light emitted by sub-pixels corresponding to the second sub-anode and the fourth sub-anode is used to form a right-eye image; or, light emitted by sub-pixels corresponding to the first sub-anode and the third sub-anode is used to form a right-eye image, and light emitted by sub-pixels corresponding to the second sub-anode and the fourth sub-anode is used to form a left-eye image;

or,
wherein a respective sub-pixel circuit of the sub-pixel circuits comprises: a thin film transistor T1, a thin film transistor T2, a thin film transistor T3, a thin film transistor T4, a thin film transistor T5, a thin film transistor T6, a thin film transistor T7 and a capacitor C1, wherein a gate electrode of the thin film transistor T1 is coupled to an (n−1)-th gate line, a first electrode of the thin film transistor T1 is coupled to a reset voltage signal line, and a second electrode of the thin film transistor T1 is coupled to a node A;

a gate electrode of the thin film transistor T2 is coupled to an n-th gate line, a first electrode of the thin film transistor T2 is coupled to a data line, and a second electrode of the thin film transistor T2 is coupled to a node B;

a gate electrode of the thin film transistor T3 is coupled to the node A, a first electrode of the thin film transistor T3 is coupled to the node B, and a second electrode of the thin film transistor T3 is coupled to a node C;

a gate electrode of the thin film transistor T4 is coupled to the n-th gate line, a first electrode of the thin film transistor T4 is coupled to the node C, and a second electrode of the thin film transistor T4 is coupled to the node A;

a gate electrode of the thin film transistor T5 is coupled to a first light-emitting control line, a first electrode of the thin film transistor T5 is coupled to the node B, and a second electrode of the thin film transistor T5 is coupled to a node D;

a gate electrode of the thin film transistor T6 is coupled to a second light-emitting control line, a first electrode of the thin film transistor T6 is coupled to the node C, and a second electrode of the thin film transistor T6 is coupled to the first sub-anode or the second sub-anode;

a gate electrode of the thin film transistor T7 is coupled to a third light-emitting control line, a first electrode of the thin film transistor T7 is coupled to the node C, and a second electrode of the thin film transistor T7 is coupled to the third sub-anode or the fourth sub-anode;

a first electrode of the capacitor C1 is coupled to the node A, and a second electrode of the capacitor C1 is coupled to the node D; and the node D is coupled to a power line, and n is a positive integer greater than 1.

12. A display device, comprising the organic light-emitting display substrate according to claim 1.

* * * * *